United States Patent [19]

Wills et al.

[11] 4,288,912
[45] Sep. 15, 1981

[54] METHOD OF CONSTRUCTING AND PROCESSING A DIODE CAPACITOR ASSEMBLY

[75] Inventors: Walter L. Wills, Mesquite, Tex.; Herchel A. Vaughn, Winter Park, Fla.; Larry L. Miller, Garland, Tex.

[73] Assignee: Varo Semiconductor, Inc., Garland, Tex.

[21] Appl. No.: 941,005

[22] Filed: Sep. 11, 1978

[51] Int. Cl.³ .................. H01L 21/603; H01L 25/16
[52] U.S. Cl. .............................. 29/577 C; 29/576 S; 29/580; 29/588; 357/51; 357/70; 357/76
[58] Field of Search ................. 29/576 C, 576 S, 577, 29/580, 588; 357/51, 70, 76

[56] References Cited

U.S. PATENT DOCUMENTS 2,911,572  11/1959  Francis .................................. 29/577
3,270,399  9/1966  Ohntrup ............................. 29/576 S
3,423,821  1/1969  Nishimura ............................ 29/577

OTHER PUBLICATIONS

IBM Technical Disclosure Bulletin, "High-Density Single-Device Memory Cell", by Barson et al., vol. 16, No. 6, Nov. 1973, p. 1698.

Primary Examiner—L. Dewayne Rutledge
Assistant Examiner—W. G. Saba
Attorney, Agent, or Firm—John S. Fosse

[57] ABSTRACT

Wafers of silicon semiconductor material are stacked, bonded and severed to form a plurality of semiconductor diodes. One or more capacitor bodies are physically and electrically joined with these diodes, either by means of the capacitor bodies themselves or by means of an intermediate lead frame structure, in order to facilitate the handling and processing of the assembly as a unit.

8 Claims, 7 Drawing Figures

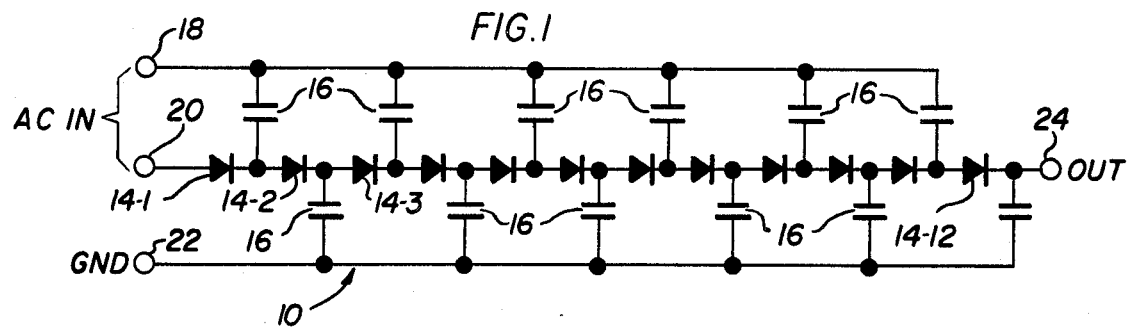
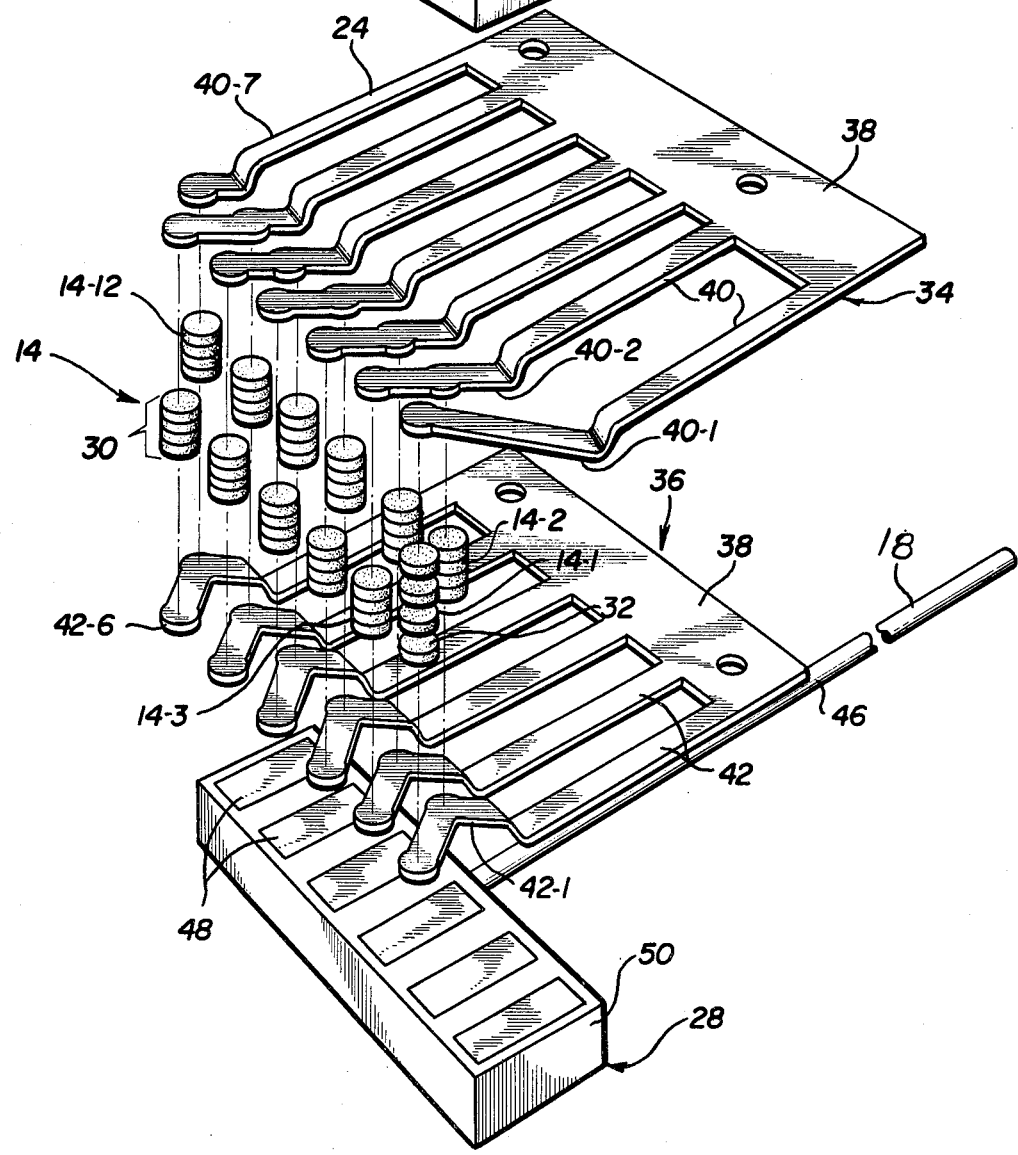

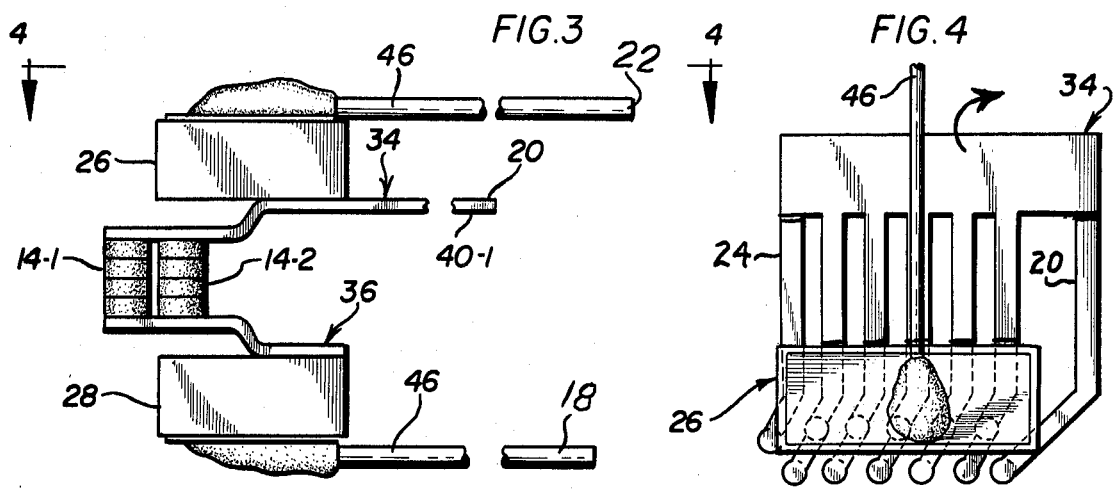
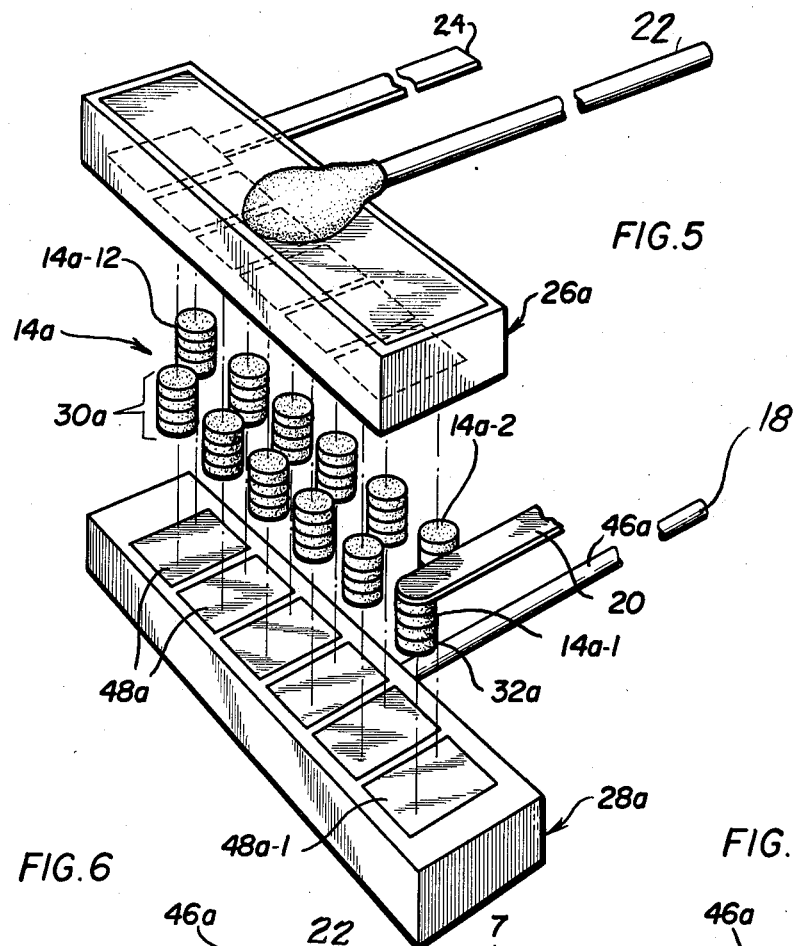
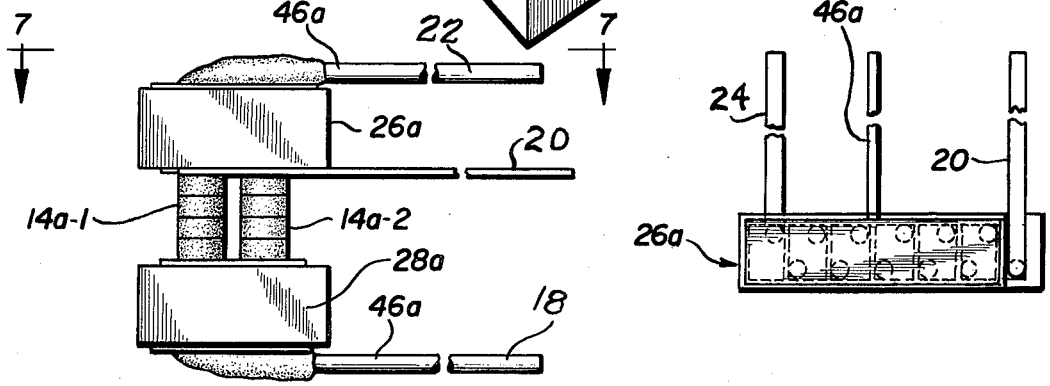

METHOD OF CONSTRUCTING AND PROCESSING A DIODE CAPACITOR ASSEMBLY

BACKGROUND OF THE INVENTION

This invention relates generally to processing of semiconductor diodes, and more particularly to the assembly of such semiconductor diodes with capacitor bodies to form an assembly such as a voltage multiplier circuit, and to the handling and processing of such assemblies.

In the past it has been common practice to stack, bond and sever silicon wafers to form individual diodes or rectifiers and to separately process these diodes or rectifiers through etching and passivation into finished, axial lead components. The latter products were then physically and electrically connected to capacitors in forming voltage multipliers. The expense and inconvenience of handling and processing the rectifiers as individual parts was thought necessary because of the prevalent view that the rectifiers could not be etched and passivated while attached to the capacitors without chemically "poisoning" the diodes, the capacitors, or both, with resultant loss in electrical effectiveness.

We have discovered that the latter view is not necessarily correct and have further discovered means by which silicon rectifier stacks can be connected with ceramic capacitor bodies as a preliminary assembly to be handled and etched as a single unit. In addition to the cost benefits of this process, substantial size reduction is realized in the finished assembly. Such size reduction is both useful and desirable in many applications.

OBJECTS AND SUMMARY OF THE INVENTION

Accordingly, it is a general object of this invention to provide a new and improved diode/capacitor assembly and method of constructing and processing the same.

A more specific object of this invention is to provide such a diode/capacitor assembly which is relatively small in size with respect to its power handling capabilities, and yet rugged and reliable in operation.

Another object is to provide such a diode/capacitor assembly which is readily connected as a unit in equipment with which it is to be utilized.

Still another object is to provide a voltage multiplier circuit as a diode/capacitor assembly which is relatively simple and inexpensive to construct and process.

Briefly, and in accordance with the foregoing objects, a diode/capacitor assembly, in accordance with this invention, is made by performing the steps of: providing a plurality of semiconductor diodes having anodes and cathodes, providing a multiple-plate capacitor having a predetermined plate configuration, physically and electrically joining predetermined plates of the multiple plate capacitor with predetermined ones of the anodes and cathodes to form a desired circuit configuration, and thereafter etching and passivating the assembled capacitors and diodes as a group.

Other objects, features and advantages of this invention will become apparent upon consideration of the following detailed descriptions taken together with the accompanying drawings.

BRIEF DESCRIPTION OF THE DRAWINGS

In the drawings

FIG. 1 is a schematic circuit diagram of a voltage multiplier circuit which may be constructed as a diode/capacitor assembly in accordance with this invention;

FIG. 2 is an exploded perspective view of a diode/capacitor assembly constructed and processed in accordance with this invention;

FIG. 3 is an end view of the diode/capacitor assembly of FIG. 2;

FIG. 4 is a view taken generally in the plane of line 4—4 of FIG. 3, and rotated 90°;

FIG. 5 is a view, similar to FIG. 2, illustrating an alternate form of diode/capacitor assembly constructed in accordance with this invention;

FIG. 6 is an end view of the assembly of FIG. 5; and

FIG. 7 is a view taken generally in the plane of line 7—7 of FIG. 6, and rotated 90°.

DETAILED DESCRIPTION OF THE ILLUSTRATED EMBODIMENT

While the principles of this invention are useful over a broad range of applications, the description will be facilitated by addressing the specific problem of constructing and processing a diode/capacitor assembly to form a voltage multiplier circuit of the type used in relatively compact night vision equipment. Such a voltage multiplier circuit is illustrated in FIG. 1, and designated generally by the reference numeral 10. In night vision equipment, the voltage multiplier circuit 10 is generally utilized to raise an AC input voltage of on the order of about 500 volts peak-to-peak applied across a pair of terminals 18, 20 to an output voltage at a terminal 24, of on the order of about 3000 volts DC with respect to ground at a terminal 22. Generally speaking, the voltage multiplier circuit 10 comprises twelve semiconductor diodes designated generally by the reference numeral 14 and twelve capacitors designated generally by the reference numeral 16; and the respective components are interconnected to form a six-stage multiplier circuit.

In the prior art, such circuits have been built, for example, of discrete components, i.e. utilizing twelve separate axial lead semiconductor diodes and twelve separate capacitors. In contrast, the present invention, as illustrated in FIG. 2, arranges two groups of six diodes 14 each in reverse polarity whereby their respective anodes and cathodes may be readily interconnected in the proper "ladder" structure with the plates of a pair of multiplier plate capacitors, 26, 28, which form the capacitors 16 of the voltage multiplier circuit configuration of FIG. 1.

Referring now to FIGS. 2, 3 and 4, the voltage multiplier circuit 10 comprises a diode/capacitor assembly in accordance with the invention, including the diodes 14 and the capacitors 26, 28. In accordance with conventional practice, each of the diodes 14 comprises a stack 30 of relatively thin wafers 32 of suitably doped silicon, or other semiconductor material, bonded together. The conventional process creates a plurality of discrete diodes by first stacking and bonding sheets or wafers of suitable semiconductor material, and then severing the stacked and bonded wafers to form the plural diode stacks 30. This portion of the process of forming the diode stacks 30 comprises no part of the present invention, and need not be described in further detail. Advantageously, the present invention eliminates the subsequent prior art process steps of separately etching and passivating the diode stacks 30, once formed. Accordingly, the present invention supplants the conventional diode forming process in this regard.

Each of the diodes 14 defines, at its respective opposite ends, an anode and a cathode. In order to form the voltage multiplier circuit 10 shown in FIG. 1, these diodes 14 are initially arranged in two staggered rows, each row containing six diodes. The diodes of each row are arranged in opposite anode to cathode polarity with respect to the diodes of the other row.

In accordance with one form of the invention, an upper lead frame member 34 and a lower lead frame member 36 are physically and electrically bonded with selected anodes and cathodes of the diodes 14. These lead frames 34, 36 each comprises a base portion 38 and plural elongate fingers designated generally 40 and 42, extending outwardly of the base portions 38. A first finger 40-1 of the lead frame member 34 is physically and electrically bonded to the anode of a first diode 14-1. The cathode of this diode 14-1, and the anode of the adjacent diode 14-2 are physically and electrically bonded to a first finger 42-1 of the lead frame member 36. Similarly, the cathode of the diode 14-2 and the anode of the next adjacent diode 14-3 are electrically and mechanically bonded with the next finger 40-2 of the lead frame member 34. The remaining anodes and cathodes of the diodes 14 are similarly joined to succeeding fingers 40, 42 of the lead frame members 34, 36 to form the anode to cathode junctions between diodes as illustrated in the circuit 10 of FIG. 1. Accordingly, the cathode of a last diode 14-12 is alone attached to a last finger 40-7 of the lead frame member 34.

The capacitors 16, as briefly described above, comprise the two multiple plate ceramic body capacitors 26 and 28. As best seen in FIG. 2, the capacitors 26 and 28 are substantially identical and each includes six of the capacitors 16 of FIG. 1. These capacitors 26 and 28 each includes a major or common plate 44 substantially coextensive with its face opposite the lead frame members 34 and 36. These major plates 44 define the plates of the capacitors 16 connected with the respective terminals 18 and 22 of the circuit diagram of FIG. 1. Accordingly, a lead 46 as affixed to each of the plates 44 to provide the terminals 18 and 22. The opposite faces of each of the capacitors 26 and 28 are divided into six substantially identical and similarly spaced smaller or minor plates 48 which comprise the plates of the capacitors 16 joined with the respective diode junctions and with the output terminal 24, as illustrated in FIG. 1.

Each of the capacitors 26, 28 includes a ceramic body 50 upon which the respective plates 44, 48 are formed, which body defines the dielectric of the capacitors 16.

The minor plates 48 are each electrically and mechanically bonded with an adjacent one of the fingers 40, 42 of the respective lead frame members 34 and 36. It will be seen that this procedure effectively joins each of these plates 48 with a different one of the junctions between diodes 14, to form the circuit configuration illustrated in FIG. 1. Consequently, the finger 40-7 provides the output terminal 24, while the finger 40-1 provides the input terminal 20.

As best seen in FIG. 4, the finger 40-1 is spaced outwardly somewhat from the remaining fingers 40 of the lead frame member 34, so as to avoid contact with the adjacent capacitor 26. This spacing of the finger 40-1 thus avoids any undesired capacitance being interposed between the terminals 20 and 22, as would otherwise be the case if the finger 40-1 were disposed at the face of the capacitor 26 opposite the common plate 44 thereof.

Alternatively, a capacitor 26 may be provided with the plates and body arranged so as to avoid the finger 40-1, and make this spacing unnecessary. Thus, each of the minor plates 48 of the capacitor 26 is joined with one of the respective fingers 40-2 through 40-7 and each of the minor plates 48 of the capacitor 28 is joined with one of the fingers 42-1 through 42-6.

In accordance with an important feature of this invention, the assembly of the capacitors, lead frame members and diode wafer stacks, as illustrated and described above, takes place prior to etching and passivating of the diodes 14.

Thereafter, a protective insulating material (not shown) is next molded around the assembly, leaving exposed only the leads from the capacitors forming the terminals 18 and 22, and the portions of the lead frames 34 and 36 remote from the capacitor bodies 26, 28.

Upon assembly and molding of the foregoing parts as described, the lead frame members are cut away, leaving only the leads thereof providing the terminals 20 and 24 of the circuit of FIG. 1. The resulting configuration is best seen in FIGS. 3 and 4, where the remaining fingers 40 and 42 of the lead frame members 34 and 36 are cut adjacent the side walls of the respective capacitors 26 and 28, leaving only the fingers 40-1 and 40-7 to provide terminals 20 and 24.

Referring now to FIGS. 5, 6, and 7, a voltage multiplier is constructed as a diode/capacitor assembly without the use of lead frames. Similar reference numerals with the subscript a, are used to designate elements similar to the like-numbered elements of FIGS. 2 and 3.

Initially, it will be seen that twelve diodes 14a are arranged in a pair of staggered rows of six diodes each. The diodes of each row are arranged in opposite anode to cathode polarity with respect to the diodes of the other row. These diodes 14a generally comprise stacks 30a of suitably doped silicon wafers 32a of the same general type described above with reference to FIG. 2. A pair of ceramic capacitors 26a, 28a each includes a first major or common plate 44a and six smaller or minor plates 48a. The capacitors 26a, 28a have their common plates 48a arranged to accommodate direct connection to selected anodes and cathodes of the diodes 14a, as shown in dotted line. Thus, it will be appreciated that these plates 48a perform the function of both the plates 48 and of the lead frame members 34, 36 of the previously discussed embodiment, inasmuch as they accommodate the mechanical and electrical connections between capacitors and diodes to form the circuit configuration of FIG. 1. In this regard, a first diode 14a-1 has its anode end free of the capacitor body 26a, to receive a suitable lead to provide the terminal 20. The opposite or cathode end of this diode 14a-1 is bonded with a first plate 48a-1 of the capacitor 28a. This first capacitor plate 48a-1 also receives the anode end of second diode 14a-2, whose opposite or cathode end is similarly bonded with a first plate of capacitor of 26a, as indicated in dotted line. In similar fashion, subsequent diodes are joined anode to cathode at succeeding capacitor plates 48a to form the circuit configuration shown in FIG. 1. Accordingly, a last diode 14a-12 has its cathode end joined at a last one of the plates 48a of the capacitor 26a, which plate also receives a suitable lead member to provide the output terminal 24.

As best seen in FIGS. 6 and 7, the leads forming terminals 18a, 20a, 22a, and 24a extend laterally outwardly of the capacitor bodies 26a, 28a and the diodes 14a assembled therebetween. As in the first embodiment, a suitable encapsulating insulating material (not shown) is molded around the capacitor bodies and diodes, leaving only these terminals exposed which have been selected for connection with other circuit elements. As in this former embodiment, the diodes 14a are etched and passivated as a group, when the capacitor/diode assembly is completed, prior to the molding of insulating material. Accordingly, the additional steps of selectively removing portions of lead frames 34 and 36 described above is also eliminated in this second embodiment. Furthermore, additional size reduction is realized.

The invention has been described in connection with specific embodiments but is not limited thereto. On the contrary, such alternatives, variations, or modifications as may occur to those skilled in the art are to be considered as forming a part of this invention, insofar as they fall within the spirit and scope of the appended claims.

The invention is claimed as follows:

1. A process for making a diode/capacitor assembly comprising the steps of: providing a plurality of semiconductor diodes each having an anode end and a cathode end, electrically and mechanically joining selected anode ends and cathode ends of said plurality of diodes to multiple-plate capacitor means to define an electrical circuit configuration of diodes and capacitors, and thereafter etching and passivating the assembled diodes and capacitors as a group.

2. The method of claim 1 wherein the step of electrically and mechanically joining includes electrically and mechanically bonding said selected anode ends and cathode ends directly to selected plates of said multiple-plate capacitor means.

3. The method of claim 1 wherein the step of electrically and mechanically joining includes the further steps of electrically and mechanically bonding selected portions of lead frame means to the selected anode and cathode ends of said plurality of diodes, and thereafter the step of electrically and mechanically bonding selected plates of said multiple-plate capacitor means to further selected portions of said lead frame means.

4. A method for making a miniature voltage multiplier circuit comprising the steps of: providing a plurality of discrete semiconductor diodes each having an anode end and a cathode end, providing multiple-plate capacitor means, electrically and mechanically joining said multiple-plate capacitor means to selected ones of said anode ends and cathode ends to form a voltage multiplier electrical circuit configuration, and etching and passivating said assembled capacitors and diodes as a group.

5. A method for making a miniature voltage multiplier circuit according to claim 4 wherein the step of electrically and mechanically joining includes the steps of electrically and mechanically bonding selected fingers of multi-fingered lead frame means to selected ones of said anode ends and cathode ends, and thereafter the step of electrically and mechanically bonding selected plates of said multiple-plate capacitor means to further selected ones of said fingers.

6. The method of claim 4 wherein the step of electrically and mechanically joining comprises electrically and mechanically bonding said selected anode ends and cathode ends to selected plates of said multiple-plate capacitor means.

7. A process for making a diode/capacitor assembly comprising the steps of: providing a plurality of semiconductor diodes each comprising a plurality of semiconductor wafers stacked to define a diode having an anode end and a cathode end, providing a dielectric body carrying a plurality of plates to define a plurality of capacitors, electrically and physically joining selected anode ends and cathode ends of said plurality of diodes to selected ones of said plates to define an electrical circuit configuration of diodes and capacitors, and thereafter etching and passivating the assembled diodes and capacitors as a group.

8. The process of claim 7 wherein the step of electrically and physically joining includes the further steps of providing lead frame means, of electrically and physically joining selected portions of said lead frame means to the selected anode and cathode ends of said plurality of diodes, and of electrically and physically joining selected ones of said plates to further selected portions of said lead frame means.

* * * * *